United States Patent
Yoo et al.

(10) Patent No.: US 7,411,217 B2
(45) Date of Patent: Aug. 12, 2008

(54) THIN FILM TRANSISTOR ARRAY SUBSTRATE AND MANUFACTURING METHOD OF THE SAME

(75) Inventors: Soon Sung Yoo, Kunpo-shi (KR); Youn Gyoung Chang, Uiwang-shi (KR); Heung Lyul Cho, Suwon-shi (KR)

(73) Assignee: LG Display Co., Ltd., Seoul (KR)

( * ) Notice: Subject to any disclaimer, the term of this patent is extended or adjusted under 35 U.S.C. 154(b) by 113 days.

(21) Appl. No.: 11/594,950

(22) Filed: Nov. 9, 2006

(65) Prior Publication Data
US 2007/0051955 A1    Mar. 8, 2007

Related U.S. Application Data

(62) Division of application No. 10/705,913, filed on Nov. 13, 2003, now Pat. No. 7,166,498.

(30) Foreign Application Priority Data
Dec. 31, 2002    (KR) .......................... 10-2002-88323

(51) Int. Cl.
*H01L 29/04* (2006.01)
(52) U.S. Cl. .................. 257/72; 257/59; 257/291; 438/149
(58) Field of Classification Search .................. 257/59, 257/72, 83, 291, 292, 293; 438/149, 384
See application file for complete search history.

(56) References Cited

U.S. PATENT DOCUMENTS

| | | | | |
|---|---|---|---|---|
| 4,855,806 A | * | 8/1989 | Parks et al. ................ | 257/59 |
| 6,078,365 A | * | 6/2000 | Ueda et al. ................ | 349/43 |
| 6,958,788 B2 | * | 10/2005 | Choi et al. ................ | 349/43 |
| 7,170,571 B2 | * | 1/2007 | Chae ........................ | 349/47 |
| 7,212,255 B2 | * | 5/2007 | Chung ....................... | 349/38 |
| 2002/0054247 A1 | | 5/2002 | Hwang et al. | |
| 2003/0197177 A1 | * | 10/2003 | Baek et al. ................ | 257/59 |
| 2003/0197181 A1 | * | 10/2003 | Yun .......................... | 257/72 |
| 2003/0197187 A1 | * | 10/2003 | Kim et al. ................. | 257/83 |
| 2004/0125309 A1 | * | 7/2004 | Nam et al. ................ | 349/149 |

FOREIGN PATENT DOCUMENTS

| | | |
|---|---|---|
| DE | 19744098 | 4/1999 |
| DE | 199 06 815 A1 | 9/1999 |
| DE | 102 20 173 A1 | 11/2002 |
| EP | 0 724 183 A2 | 7/1996 |
| JP | 06-102528 | 4/1994 |

(Continued)

*Primary Examiner*—Fernando L Toledo
(74) *Attorney, Agent, or Firm*—McKenna, Long & Aldridge LLP

(57) ABSTRACT

A thin film transistor array substrate has a gate electrode of the thin film transistor, a gate line connected to the gate electrode, and a gate pad connected to the gate line; a source/drain pattern including a source electrode and a drain electrode of the thin film transistor, a data line connected to the source electrode, a data pad connected to the data line, a storage electrode formed and superimposed with the gate line; a semiconductor pattern formed in low part of the substrate; a transparent electrode pattern including a pixel electrode connected to the drain electrode and the storage electrode, a gate pad protection electrode covering the gate pad, and a data pad protection electrode covering the data pad; and a protection pattern and a gate insulation pattern stacked in a region other than the region where the transparent electrode pattern is formed.

4 Claims, 16 Drawing Sheets

FOREIGN PATENT DOCUMENTS

| | | |
|---|---|---|
| JP | 08-087033 | 4/1996 |
| JP | 2000-206571 | 7/2000 |
| JP | 2001507481 W * | 6/2001 |
| JP | 2002-176062 | 6/2002 |

* cited by examiner

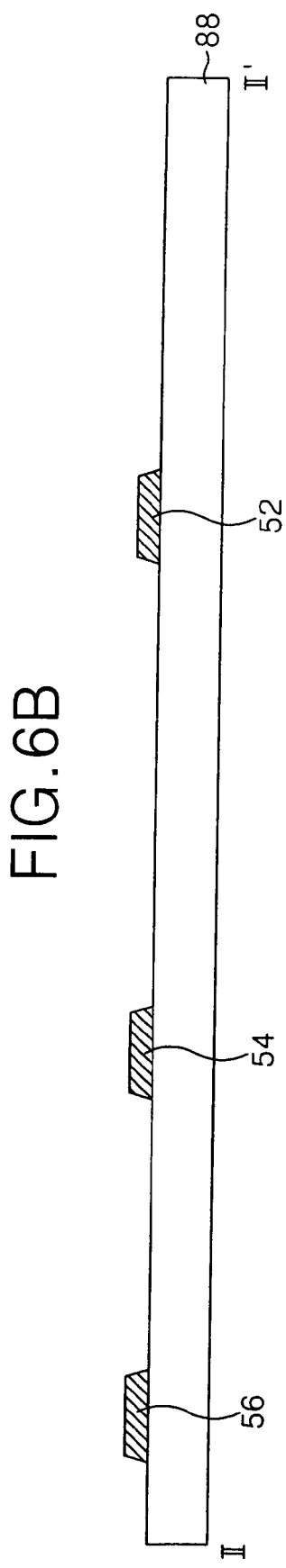

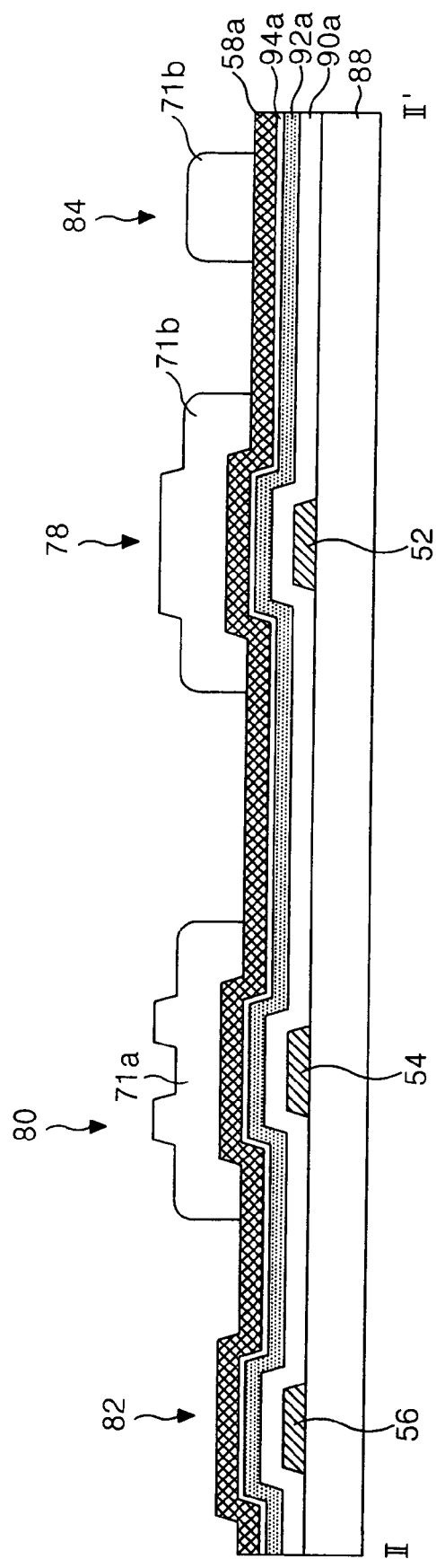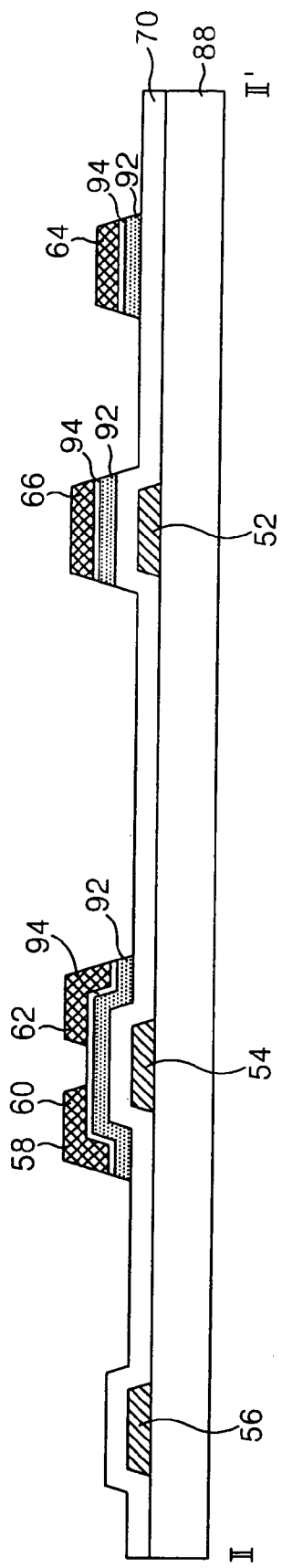

THIN FILM TRANSISTOR ARRAY SUBSTRATE AND MANUFACTURING METHOD OF THE SAME

This application is a Divisional of application Ser. No. 10/705,913 filed Nov. 13, 2003 now U.S. Pat. No. 7,166,498, which is hereby incorporated by reference as if fully set forth herein. This application claims the benefit of Korean Patent Application No. 10-2002-88323, filed on Dec. 31, 2002, which is hereby incorporated by reference for all purposes as if fully set forth herein.

BACKGROUND OF THE INVENTION

1. Field of the Invention

The present invention relates to a thin film transistor array substrate and a manufacturing method of the same, and more particularly to the thin film transistor array substrate and the manufacturing method of the same capable of reducing the number of mask processes.

2. Discussion of the Related Art

In general, a liquid crystal display represents an image by means of adjusting a transmissivity of light of the liquid crystal by use of an electric field. For this purpose, the liquid crystal display comprises a liquid crystal display panel where the liquid crystal cells are arranged by a matrix type, and a driving circuit for driving the liquid crystal display panel.

The liquid crystal display panel comprises a thin film transistor array substrate and a color filter array substrate facing each other, a spacer located for maintaining a designated cell gap between two substrates, and the liquid crystal filling to the cell gap.

The thin film transistor array substrate includes gate lines and data lines, a thin film transistor formed as a switching device at every intersection of the gate lines and the data lines, a pixel electrode connected to the thin film transistor formed by the liquid crystal cell unit, and an alignment film spread thereon. The gate lines and the data lines receive signals from driving circuits through each of the pad part. The thin film transistor responds to a scan signal supplied to the gate line, and supplies to the pixel electrode a pixel voltage signal supplied to the data line.

The color filter array substrate includes the color filters formed by the liquid crystal cell unit, a black matrix for reflecting outside light and separating between the color filters, a common electrode commonly supplying a reference voltage to the liquid crystal cells, and an alignment film spread thereon.

The liquid crystal display panel combines a specially manufactured thin film transistor array substrate and color filter array substrate, in which liquid crystal is injected there between, after which the panel is sealed. With respect to this liquid crystal panel, the thin film transistor array substrate includes a semiconductor process and in addition includes a plurality of mask processes. Accordingly, the manufacturing process is complicated and this is the main cause of the rising costs of manufacturing the liquid crystal display panel. In order to solve this problem, the thin film transistor array substrate is improved in order to reduce the number of mask processes. The reason for this is that in one mask process, many sub-processes such as an evaporation process, a cleaning process, a photolithography process, an etching process, a photoresist stripping process, and an inspection process are all included in one mask process. Recently, 4-mask process have appeared, replacing more conventional 5-mask process.

FIG. 1 is a plane view illustrating the thin film transistor array substrate adopting a mask process, and FIG. 2 is a sectional view illustrating as cutting along line I-I' the thin film transistor array substrate as shown in FIG. 1.

The thin film transistor array substrate as shown in FIG. 1 and FIG. 2 comprises gate lines 2 and data lines 4 formed as intersecting each other and putting a gate insulation film there between on a lower substrate 42, a thin film transistor 6 formed at every intersection, and a pixel electrode 18 formed in the cell region arranged by the intersection. And the thin film transistor array substrate comprises a storage capacitor 20 formed at a superimposed part of the pixel electrode 18 and the former gate line 2, a gate pad part 26 connected to the gate line 2, and a data pad part 34 connected to the data line 4.

The thin film transistor 6 comprises a gate electrode 8 connected to the gate line 2, a source electrode 10 connected to the data line 4, a drain electrode 12 connected to a pixel electrode 16, an active layer 14 forming a channel between the source electrode 10 and the drain electrode 12 superimposed with the gate electrode 8. The active layer 14 is formed as being superimposed with the data pad 36, the storage electrode 22, the data line 4, the source electrode 10, and the drain electrode 12, and further comprises the channel part between the source electrode 10 and the drain electrode 12. On the active layer 14, the data pad 36, the storage electrode 22, the data line 4, the source electrode 10, the drain electrode 12, and an ohmic contact layer 48 for ohmic contact are further formed. This thin film transistor 6 responds to the gate signal supplied to the gate line 2 and provides a pixel voltage signal supplied to the data line 4 at the pixel electrode 18.

The pixel electrode 18 is connected to the drain electrode 12 of the thin film transistor 6 through a first contact hole 16 penetrating a protection film 50. The pixel electrode 18 generates a voltage difference from the common electrode formed on the upper substrate (not shown) when a pixel voltage is provided. By this voltage difference, the liquid crystal located between the thin film transistor substrate and the upper substrate rotates due to a dielectric anisotropy, and allows incident light passing through the pixel electrode 18 from the light source (not shown) to be emitted to the upper substrate.

The storage capacitor 20 comprises a former stage gate line 2, a storage electrode superimposed over the gate line 2, the gate insulation film 44, the active layer 14, the ohmic contact layer 48 there between, and the pixel electrode 22 connected through the second contact hole 24 formed at the protection film 50. In addition the capacitor 20 superimposes the storage electrode 22 over the protection film 50. This storage capacitor 20 makes the pixel voltage supplied to the pixel electrode 18 constant until the next pixel voltage is supplied thereto.

The gate line 2 is connected to the gate driver (not shown) through the gate pad part 26. The gate pad part 26 comprises the gate pad 28 extended from the gate line 2 and the gate pad protection electrode 32 connected to the gate pad 28 through the third contact hole 30 penetrating the gate insulation film 44 and the protection film 50.

The data line 4 is connected to the data driver (not shown) through the data pad part 34. The data pad part 34 comprises the data pad 36 extended from the data line 4 and the data pad protection electrode 40 connected to the data pad 36 through the fourth contact hole 38 penetrating the protection film 50.

The thin film transistor array substrate having this constitution is fabricated by a 4-mask process.

FIG. 3a and FIG. 3d are sectional views illustrating the method of manufacturing the thin film transistor array substrate.

Referring to FIG. 3a, the gate patterns are formed on the lower substrate 42.

On the lower substrate 42, the gate metal layer is formed by an evaporation method such as a sputtering method. Subsequently, the gate metal layer is patterned by the photolithography process using the first mask and the etching process thereby forming the gate patterns including a gate line 2, a gate electrode 8, and a gate pad 28. As a gate metal, chrome (Cr), molybdenum (Mo), aluminum (Al), or the like can be used for the single layer or the double layer structure.

Referring to FIG. 3b, on the lower substrate 42 where the gate patterns are formed, a gate insulation film 44, an active layer 14, an ohmic contact layer 48, and a source/drain patterns are subsequently formed also.

On the lower substrate 42 where the gate pattern is formed by the evaporation method such as a PECVD, a sputtering, or the like, a gate insulation film 44, an amorphous silicon layer, a n+ amorphous silicon layer, and the source/drain metal layer are subsequently formed.

On the source/drain metal layer, a photoresist pattern is formed by a photolithography process using the second mask. In this case, for the second mask, a diffraction exposure mask having the diffraction exposure part in the channel part of the thin film transistor is used. The photoresist pattern of the channel part has a height lower than the other source/drain pattern part.

Subsequently, the source/drain metal layer is patterned by a wet etching process using the photoresist pattern, and the source/drain patterns including the data line 4, the source electrode 10, the drain electrode 12 combined as one body with the source electrode 10, and the storage electrode 22 are formed.

Then, the n+ amorphous silicon layer and the amorphous silicon layer are at the same time patterned by a dry etching process using the same photoresist pattern, and thus the ohmic contact layer 48 and the active layer 14 are formed.

In the channel part after the photoresist pattern having a low relative height is removed by the ashing process, the source/drain pattern of the channel part and the ohmic contact layer 48 are etched by the dry etching process. In this way, the active layer 14 of the channel part is exposed and the source electrode 10 and the drain electrode 12 are separated.

Subsequently, the photoresist pattern existing on the source/drain pattern part is removed by the strip process.

As a material for the gate insulation film 44, an inorganic insulation material like as a silicon oxide (SiOx) or a silicon nitride (SiNx) is used. As a source/drain metal, a molybdenum (Mo), a titanium (Ti), a tantalum (Ta), molybdenum alloy, or the like are used.

Referring to FIG. 3c, on the gate insulation film 44 where the source/drain patterns are formed, the protection film 50 including the first to the fourth contact holes 16, 24, 30, 38 are formed.

On the gate insulation film 44 where the source/drain patterns are formed, the protection film 50 is wholly formed by the evaporation method like as PECVD. The protection film 50 is patterned by the photolithography process and the etching process using the third mask, forming the first to the fourth contact holes (16,24,30,38. The first contact hole 16 penetrates the protection film 50 and is formed so that the drain electrode 12 is exposed. The second contact hole 24 penetrates the protection film 50 and is formed so that the storage electrode 22 is exposed. The third contact hole 30 penetrates the protection film 50 and the gate insulation film 44 and is formed so that the gate pad 28 is exposed. The fourth contact hole 38 penetrates the protection layer 50 and is formed so that the data pad 6 is exposed.

As a material for the protection film 50, an inorganic insulation material like that used as the gate insulation film 94 or an organic insulation material such as an acryl organic compound, BCB, and PFCB having a dielectric coefficient that is low is used.

Referring to FIG. 3d, the transparent electrode patterns are formed on the protection film 50.

On the protection film 50, the transparent electrode material is wholly evaporated by the evaporation method such as the sputtering. Subsequently, the transparent electrode material is patterned by the photolithography process and the etching process using the fourth mask, forming the transparent electrode pattern including the pixel electrode 18, the gate pad protection electrode 32, and the data pad protection electrode 4. The pixel electrode 18 is electrically connected to the drain electrode 12 through the first contact hole 16 and is electrically connected to the storage electrode superimposed with a former stage gate line 2 through the second contact hole 24. The gate pad protection electrode 32 is electrically connected to the gate pad 28 through the third contact hole 30. The data pad protection electrode 40 is electrically connected to the data pad 36 through the fourth contact hole 38. As the transparent electrode material, Indium Tin Oxide (ITO), Tin Oxide (TO), or Indium Zinc Oxide (IZO) is used. The related art thin film transistor substrate and the manufacturing method such as this reduce the number of manufacture processes by adopting a 4-mask process in contrast with the 5-mask process previously used. In addition, this can decrease the manufacturing cost proportionally. But, because the manufacturing process of the 4-mask process is still complicated, the potential cost reduction is limited. It is required that the thin film transistor substrate and the manufacture method thereof further reduce the manufacturing cost by further simplifying the manufacturing process.

SUMMARY OF THE INVENTION

Accordingly, it is an advantage of the present invention to provide a thin film transistor array substrate and a manufacturing method thereof capable of decreasing the number of mask processes.

Accordingly, the present invention is directed to a thin film transistor array substrate and a manufacturing method of the same capable for decreasing a mask process number that substantially obviates one or more of the problems due to limitations and disadvantages of the related art.

An advantage of the present invention is to provide the thin film transistor array substrate comprises a gate pattern including on the thin film transistor array substrate a gate electrode of the thin film transistor, a gate line to which the gate electrode is connected, and a gate pad to which the gate line is connected; a source/drain pattern including a source electrode and a drain electrode of the thin film transistor, a data line connected to the source electrode, a data pad connected to the data line, a storage electrode formed and superimposed with the gate line; a semiconductor pattern formed in low part in accordance to the source/drain pattern; a transparent electrode pattern including a pixel electrode connected to the drain electrode and the storage electrode, a gate pad protection electrode formed capable for covering the gate pad, and a data pad protection electrode formed capable for covering the data pad; and a protection pattern and a gate insulation pattern stacked in the rest region except for the region where the transparent electrode pattern is formed.

The protection pattern partly exposes the drain electrode and the storage electrode and is connected to the pixel electrode.

A manufacturing method of the thin film transistor array substrate comprises: forming by use of a first mask process a gate electrode of the thin film transistor on the substrate, a gate line connected to the gate electrode a gate pattern including the gate pad connected to the gate line; forming a gate insulation film on the substrate where the gate pattern is formed; forming by use of a second mask process a source electrode and a drain electrode of the thin film transistor on the gate insulation film, a data line connected to the source electrode, a data pad connected to the data line, a source/drain pattern including a storage electrode in the region superimposed with the gate line, and a semiconductor pattern formed in accordance with the source/drain pattern on the low part; and forming by use of a third mask process a pixel electrode connected to the drain electrode and the storage electrode, a gate pad protection electrode formed to cover the gate pad, a transparent electrode pattern including the data pad protection electrode formed to cover the data pad, and a gate insulation pattern and a protection film pattern stacked in the rest region except for the region where the transparent electrode pattern is formed.

The second mask process uses a diffraction exposure mask having the diffraction exposure part in the channel part of the thin film transistor.

The second mask process comprises: sequentially forming a semiconductor layer, and a source/drain metal layer on the gate insulation film; forming by use of the diffraction exposure mask a photoresist pattern where the channel part of the thin film transistor has a height lower than the source/drain pattern part; patterning the source/drain metal layer and the semiconductor layer by use of the photoresist pattern; ashing the photoresist pattern as much as prescribed depth; removing a source/drain metal layer of the channel part of the thin film transistor by use of the ashed photoresist pattern; and removing the photoresist pattern by a strip process.

The third mask process comprises: forming a protection film on the substrate where source/drain pattern is formed; forming the photoresist pattern by use of the third mask; forming the gate insulation pattern and the protection film pattern by patterning the protection film and the insulation film by use of the photoresist pattern; evaporating a transparent electrode material on the substrate where the photoresist pattern exists; and forming the transparent electrode pattern by removing by strip process the photoresist pattern and the transparent electrode material on that.

The protection film pattern exposes the drain electrode and the storage electrode partly and is connected to the pixel electrode.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 6a through 8d are sectional views illustrating methods of manufacture of a thin film transistor array substrate according to a number of embodiments of the present invention.

DETAILED DESCRIPTION OF THE ILLUSTRATED EMBODIMENTS

Reference will now be made in detail to some embodiments of the present invention, example of which is illustrated in the accompanying drawings.

With reference to FIG. 4 to FIG. 8d, an embodiment of the present invention will be described in full detail.

Figure 1:
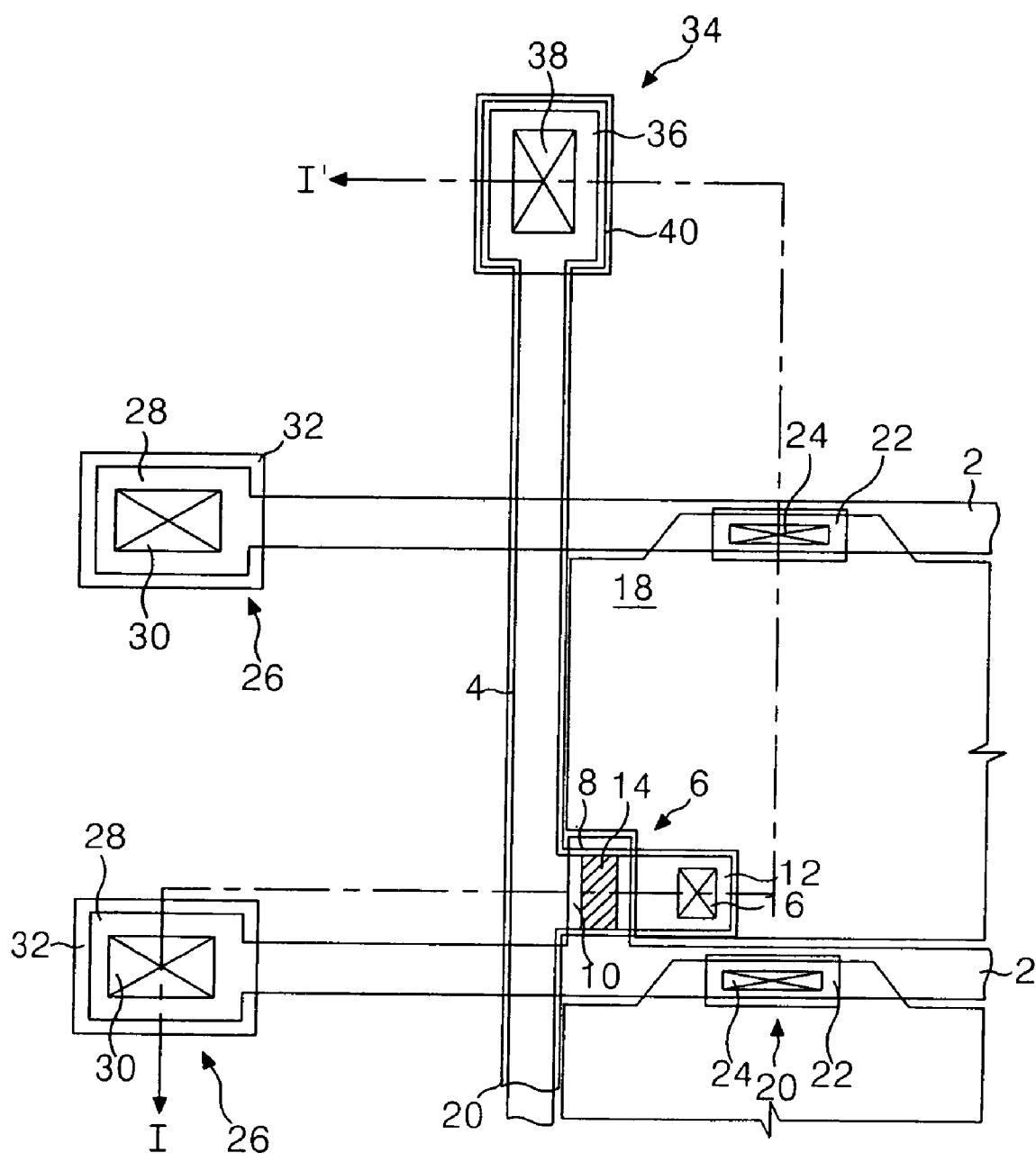
FIG. 1 is a plane view illustrating a part of a conventional thin film transistor array substrate.
Figure 2:
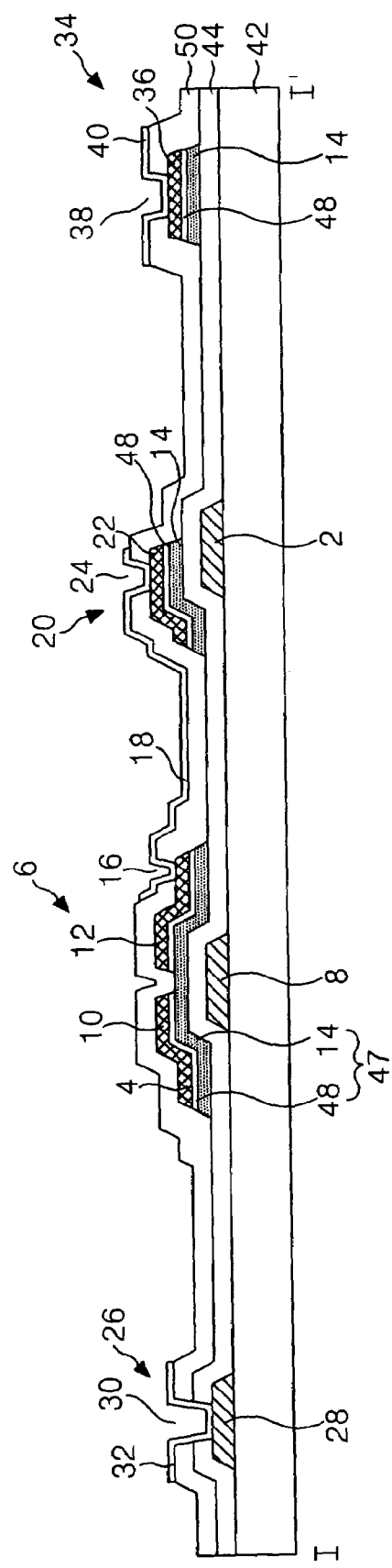
FIG. 2 is a sectional view illustrating a thin film transistor array substrate as shown in FIG. 1 along line I-I'.
Figure 3A:
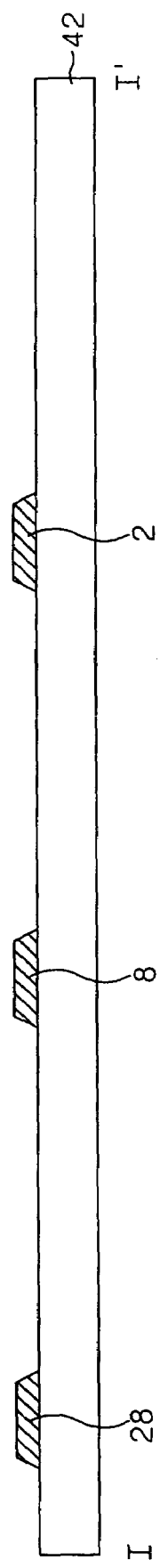
FIGS. 3a to 3d are sectional views illustrating a method of manufacture of a thin film transistor array substrate as shown in FIG. 2.
Figure 3B:
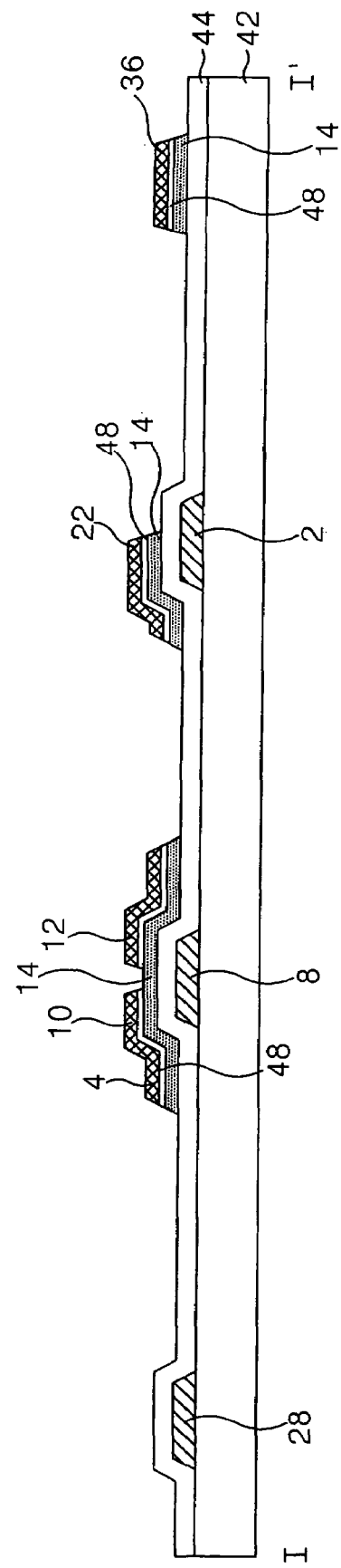
Figure 3C:
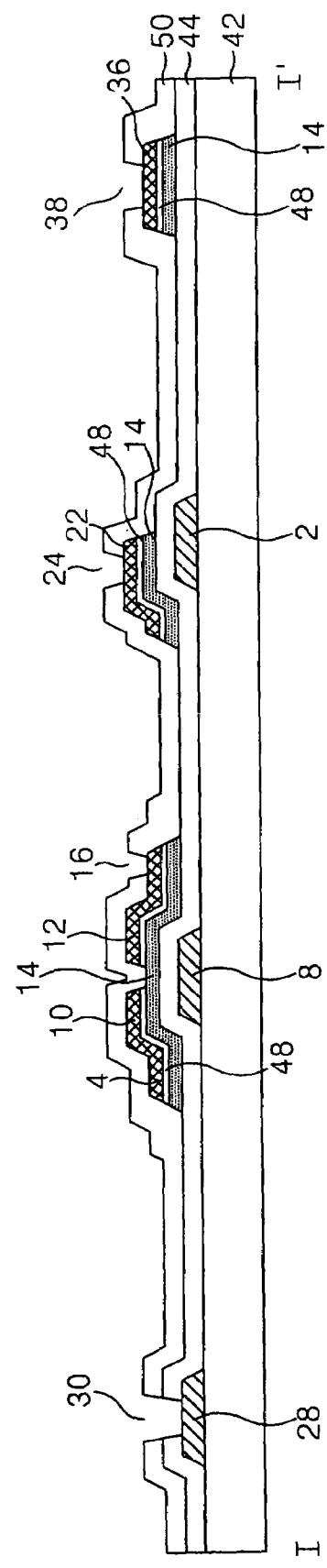
Figure 3D:
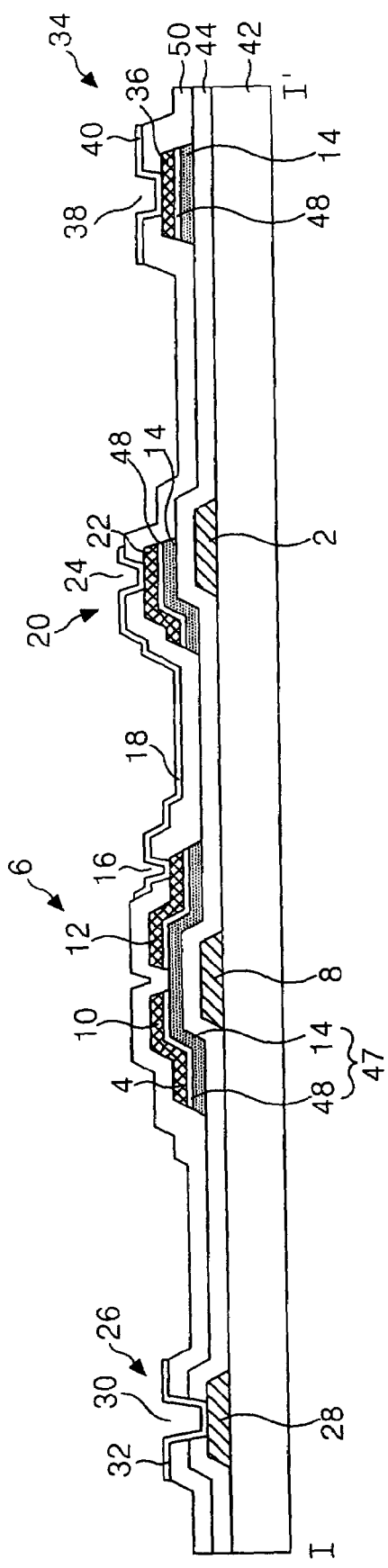
Figure 4:
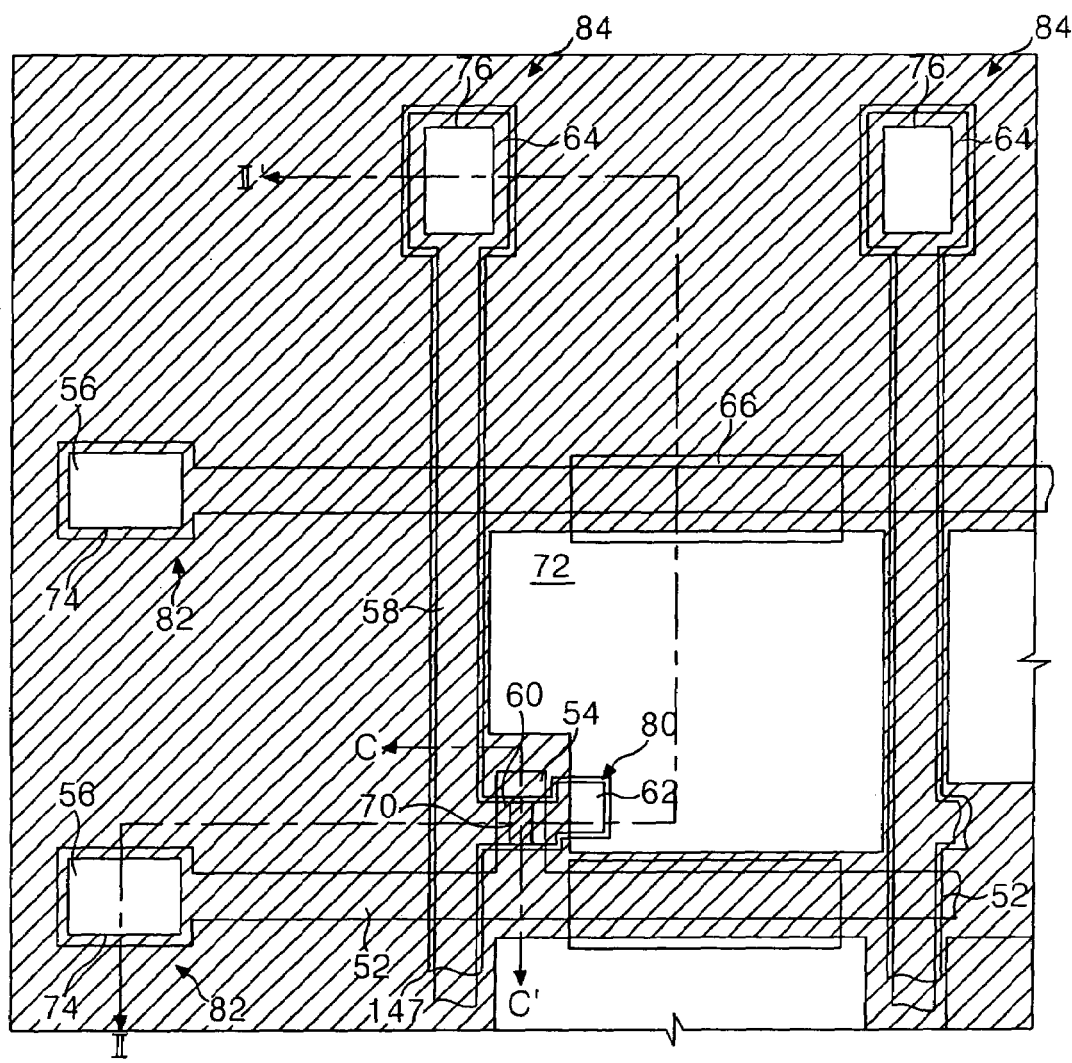
FIG. 4 is a plane view illustrating a thin film transistor array substrate according to an embodiment of the present invention.
Figure 5:
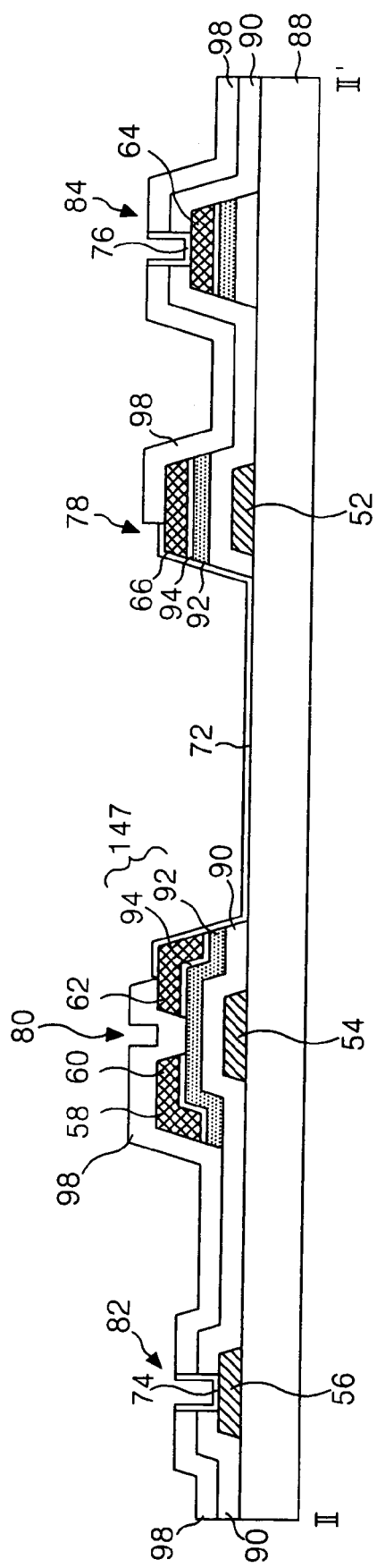
FIG. 5 is a sectional view illustrating a thin film transistor array substrate as shown in FIG. 4 along line II-II'.

FIG. 4 is a plane view illustrating a thin film transistor array substrate according to an embodiment of the present invention, and FIG. 5 is a sectional view illustrating a thin film transistor array substrate as shown in FIG. 4 along line II-II'.

The thin film transistor array substrate as shown in FIG. 4 and FIG. 5 comprises a gate line 52, intersecting a data line 58 and a gate insulation pattern 90 at an interval on a lower substrate 88, a thin film transistor 80 formed at every intersection, and a pixel electrode 72 formed in the cell region arranged by the intersection structure. And the thin film transistor array substrate comprises a storage electrode 66 connected to the pixel electrode 72, a storage capacitor 78 formed by the superimposed part of a former stage gate line 52, a gate pad part 82 connected to a gate line 52, and a data pad part 84 connected to a data line 58.

The thin film transistor 80 comprises a gate electrode 54 connected to the gate line 52, a source electrode 60 connected to the data line 58, a drain electrode 62 connected to the pixel electrode 72, and a semiconductor pattern including an active layer 92 forming a channel 70 between the source electrode 60 and the drain electrode 72 and being superimposed on the gate electrode 54 and a gate insulation pattern 90. The thin film transistor 80 responds to a gate signal supplied to the gate line 52 and makes a pixel voltage signal supplied over the data line 58 to the pixel electrode 72 constant.

The semiconductor pattern includes a channel part between the source electrode 60 and the drain electrode 62 and is superimposed with the source electrode 60, the drain electrode 62, the data line 58 and the data pad 64. It puts the gate insulation pattern 90 superimposed with the storage electrode 66, and comprises the active layer 92 formed and superimposed partly with gate line 52. And the semiconductor pattern further comprises a source electrode 60, a drain electrode 62, a storage electrode 66, a data line 58, and an ohmic contact layer 66 formed for ohmic contact with data pad 64 on the active layer 92.

The pixel electrode 72 is connected to the drain electrode of the thin film transistor 80 exposed to the outside of protection film pattern 98. The pixel electrode 72 generates a voltage difference from a common electrode formed on an upper substrate (not shown) by a charged pixel voltage. By this voltage difference, the liquid crystal located between the thin film transistor substrate and the upper substrate rotates due to dielectric anisotropy and allows an incident light passes through the pixel electrode 72 from light source (not shown) to penetrate to the upper substrate.

The storage capacitor 78 is superimposed with a former stage gate line 52, the gate insulation pattern 90, the active layer 92, and the ohmic contact hole 94 at an interval or distance from, and connected to the storage electrode 66 exposed to the outside of the protection film 98. The storage capacitor 78 makes the pixel voltage charged to the pixel electrode 72 constant until next pixel voltage is charged.

The gate line 52 is connected to a gate driver (not shown) through a gate pad part 82. The gate pad part 82 includes the gate pad 56 extended from the gate line 52 and the gate pad protection electrode 74 connected on the gate pad 56.

The data line 58 is connected to the data driver (not shown) through a data pad part 84. The data pad part 84 comprises the data pad 64 extended from the data line 58 and the data pad protection electrode 76 connected on the data pad 64. Further, the data pad part 84 comprises the gate insulation pattern 90 formed between the data pad 64 and the lower substrate 88, the active layer 92 and ohmic contact layer 94.

The gate insulation pattern 90 and the protection film pattern 98 are formed in the region where the pixel electrode 72, the gate pad protection electrode 74, and the data pad protection pad 76 are not formed.

The thin film transistor array substrate having this constitution is formed by a 3-mask process. The thin film transistor array substrate manufacturing method according to the embodiment of the present invention using the 3-mask process comprises the first mask process for forming the gate patterns, the second mask process for forming the semiconductor pattern and the source/drain pattern, and the third mask process for forming the gate insulation pattern 90, the protection film pattern 98, and the transparent electrode pattern.

FIG. 6a to FIG. 8d are plane views and sectional views, respectively, illustrating sequentially the thin film transistor array substrate manufacturing method according to an embodiment of the present invention.

Figure 6A:
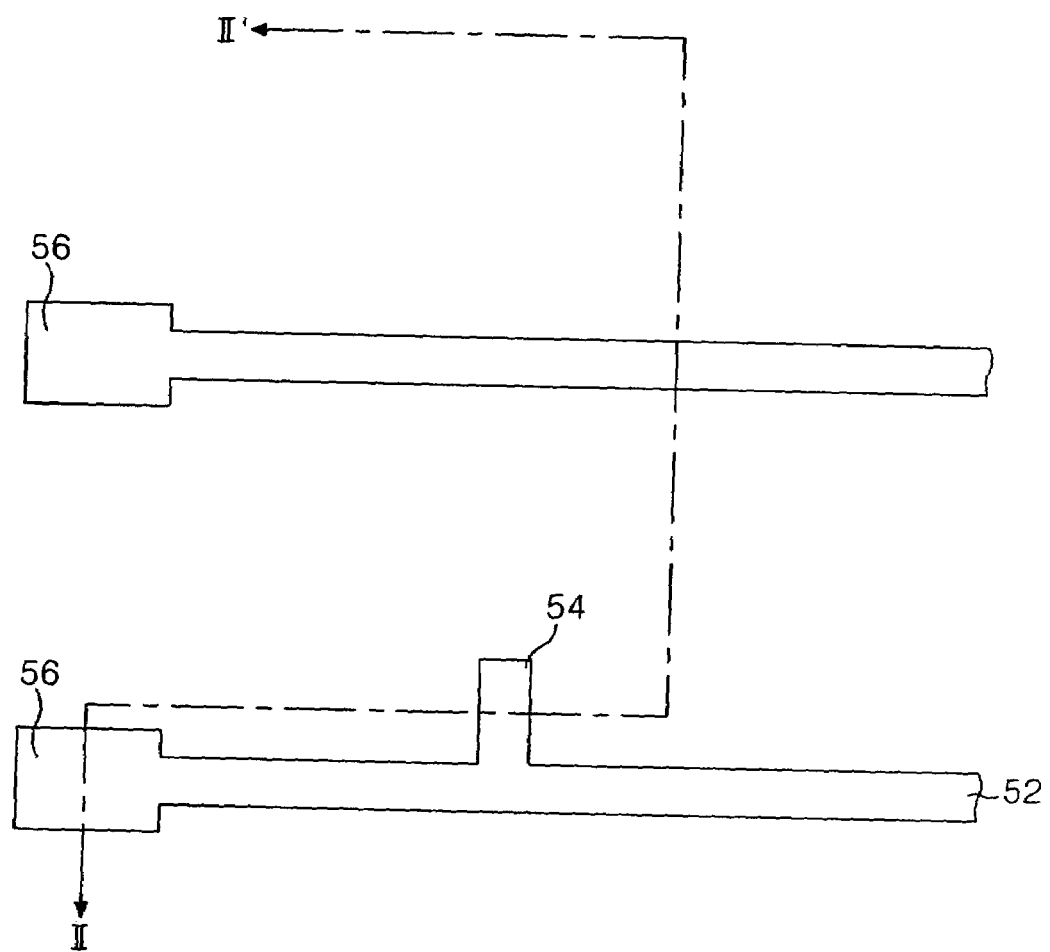

FIG. 6a and FIG. 6b are a plane view and a sectional view illustrating the gate patterns formed on the lower substrate 88 as the first mask process among the thin film transistor array substrate manufacturing method according to an embodiment of the present invention.

The gate metal layer is formed by the evaporation method like a sputtering method on the lower substrate 88. Subsequently, the gate metal layer is patterned by the photolithography process and the etching process using the first mask. Then the gate patterns including the gate line 52, the gate electrode 54, and the gate pad 56 are formed. As the gate metal, Cr, MoW, Cr/Al, Cu, Al(Nd), Mo/Al, Mo/Al(Nd), Cr/Al(Nd) and so on are used by the single layer or the double layer structure.

Figure 7A:
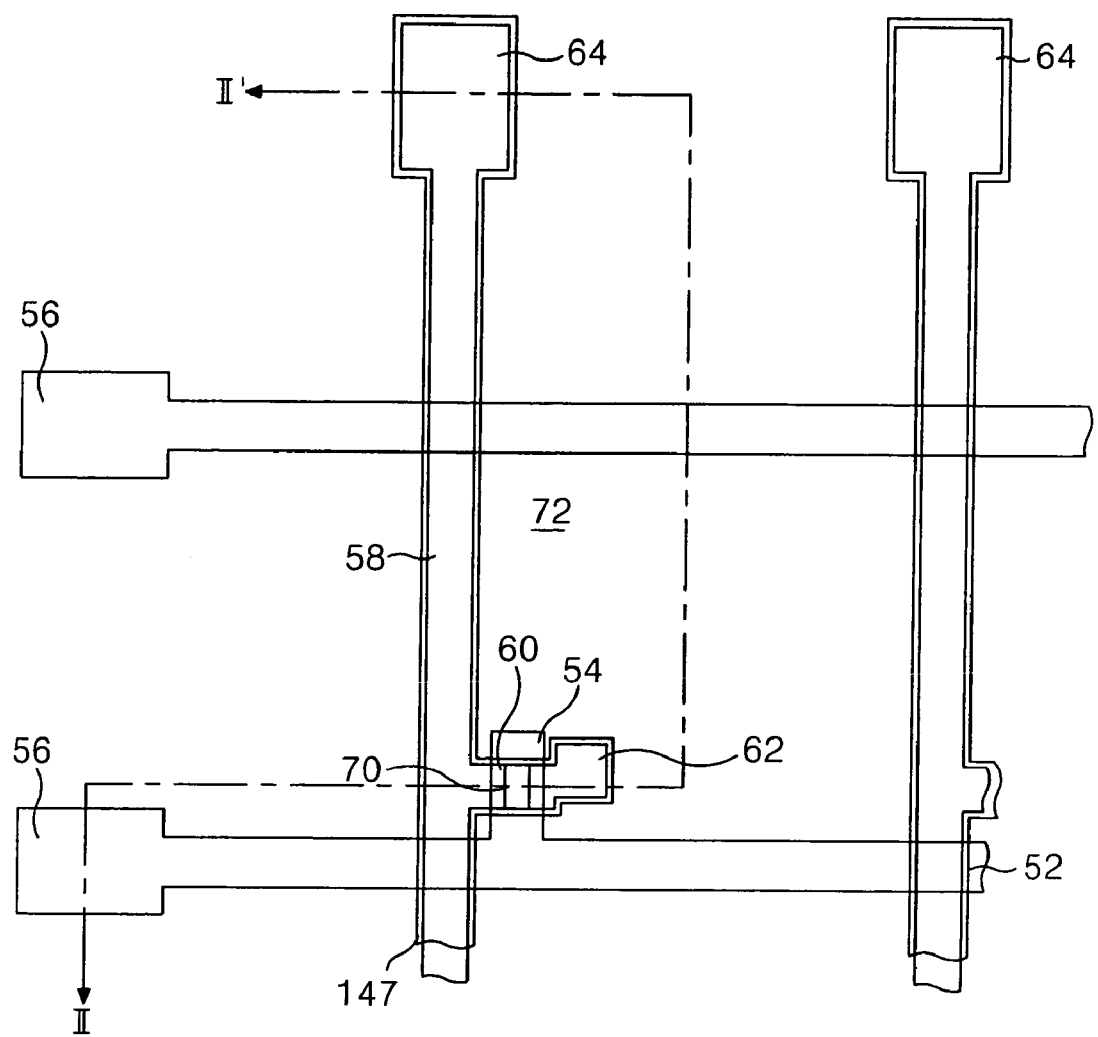

FIG. 7a to FIG. 7c are plane view and sectional view of the substrate including the source/drain pattern, the semiconductor pattern formed by the second mask process among the thin film transistor array substrate manufacturing method according to an embodiment of the present invention.

More specifically, on the lower substrate 88 where the gate patterns are formed, by the evaporation method like as PECVD, sputtering, and so on, a gate insulation layer 90a, an amorphous silicon layer, a n+ amorphous silicon layer and source/drain metal layer are sequentially formed. As the material for the gate insulation layer 90a, the inorganic insulation material like as the oxide silicon (SiOx) or nitride silicon (SiNx) and so on is used. As the source/drain material, a molybdenum, a titanium, a tantalum, a molybdenum alloy and so on are used.

Subsequently, as shown in FIG. 7b, by the photolithography process and the etching process using the second mask, a photoresist pattern 71b is formed. In this case, as the second mask, by means of using the diffraction exposure mask having the diffraction exposure part in the channel part of the thin film transistor, the photoresist pattern of the channel part has a lower height than that of the source/drain pattern part.

Subsequently, referring to FIG. 7c, by way of an wet etching process using photoresist pattern 71b, the source/drain metal layer is patterned and so the source/drain patterns including the data line 58, the source electrode 60, the drain electrode 62 and the source electrode 60, and the storage electrode 64 are formed.

And then by the dry etching process using the same photoresist pattern 71b, the n+ amorphous silicon layer and the amorphous silicon layer are patterned at the same time and so the ohmic contact layer 94 and the active layer 92 are formed.

In the channel part, after the photoresist pattern 71a having relatively low height is removed by the ashing process, the source/drain pattern of the channel part and ohmic contact hole 94 are etched by the dry etching process. The active layer 92 of the channel part is thus exposed, and the source electrode 60 and the drain electrode 62 are separated.

Subsequently, the photoresist pattern existing on the source/drain pattern part is removed by the strip process.

FIG. 8a through FIG. 8d are plane views and sectional views of the substrate including the gate insulation pattern 90, the protection film pattern 98 and the transparent electrode pattern formed by the third mask process among the thin film transistor array substrate manufacturing method according to an embodiment of the present invention.

Figure 8A:
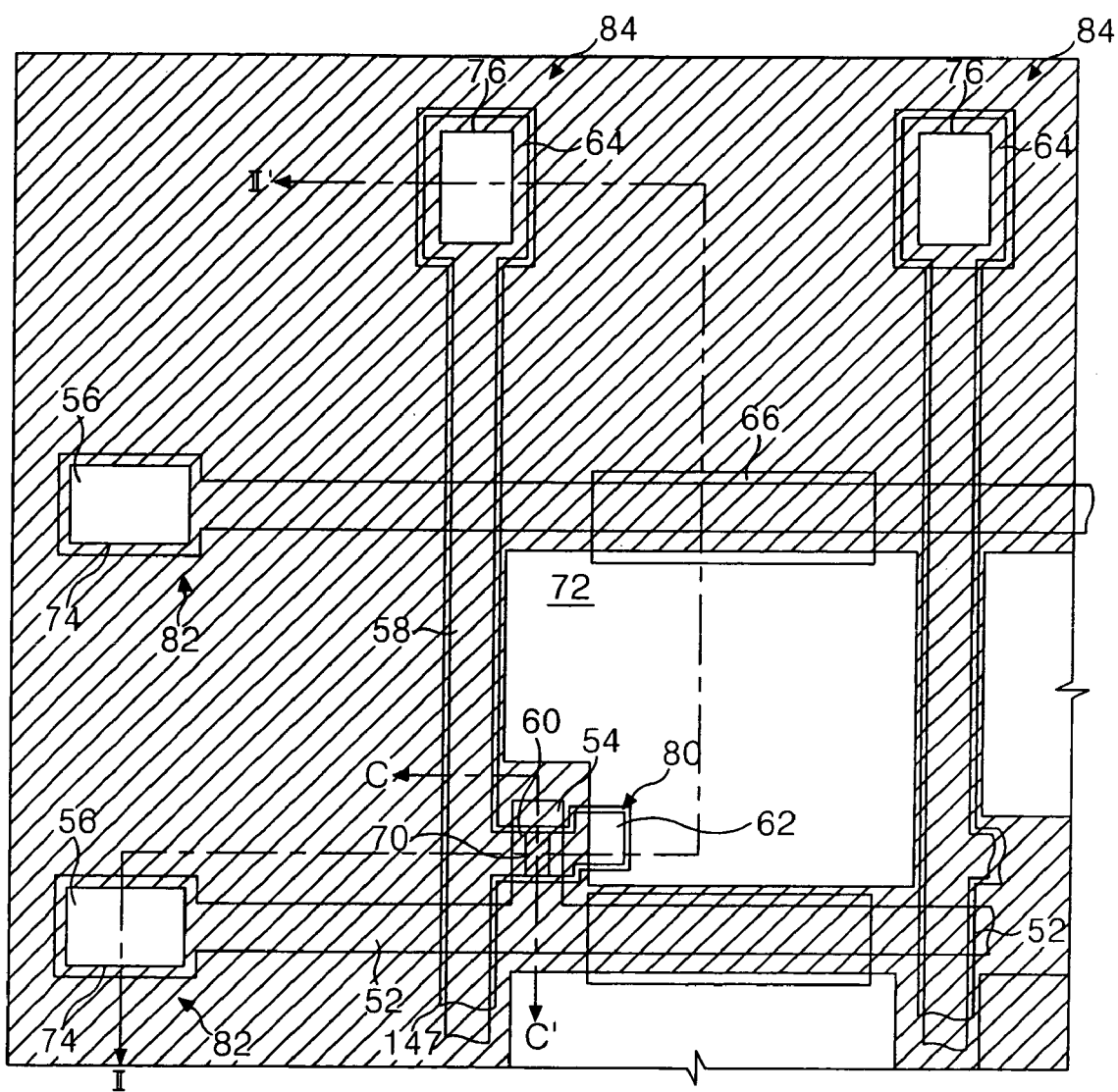
Figure 8B:
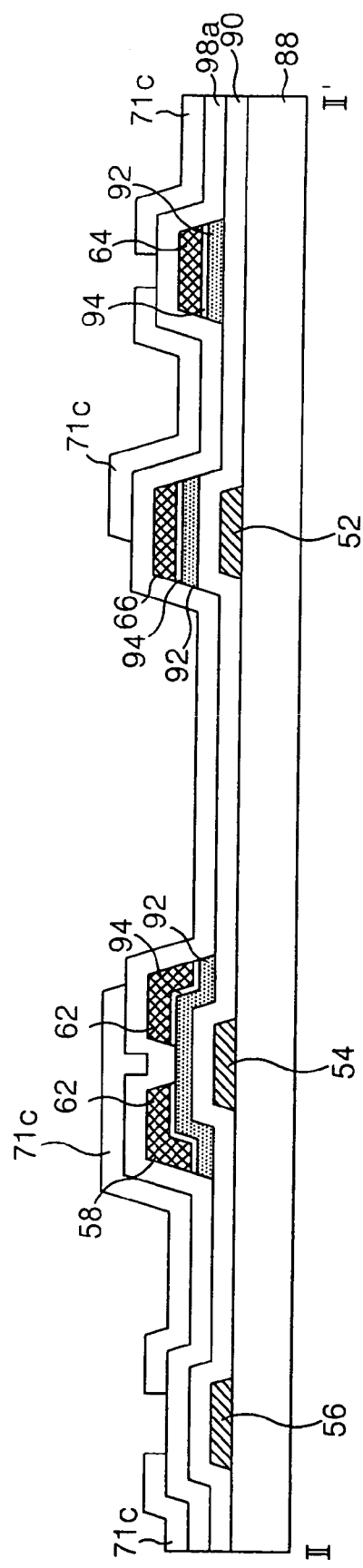
Figure 8C:
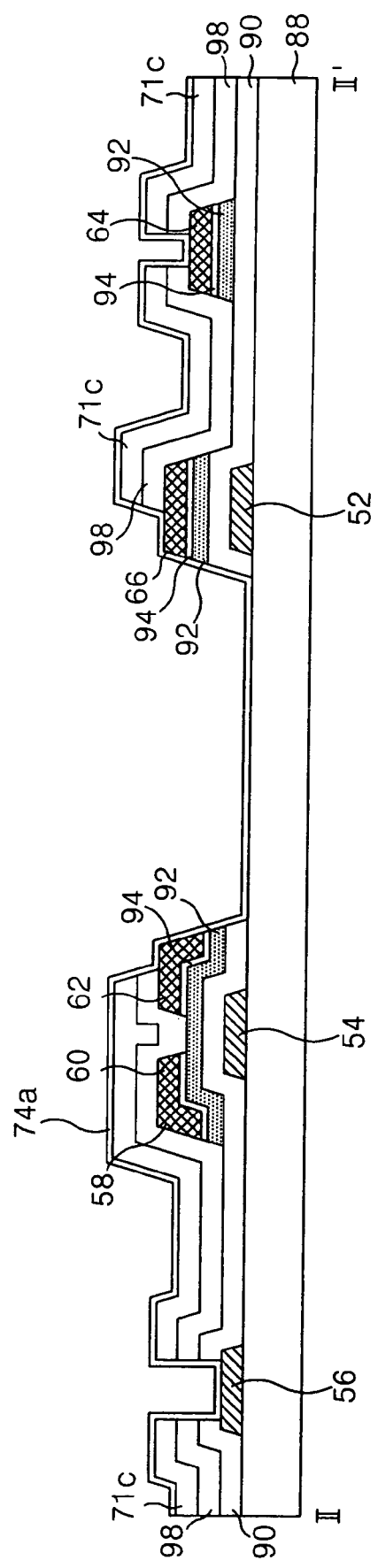
Figure 8D:
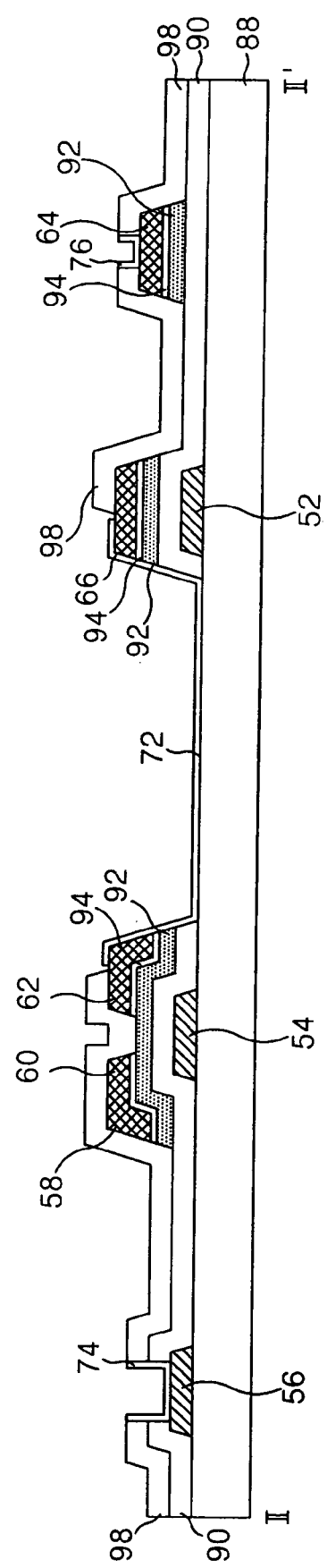

More specifically, on the gate insulation film 90a where the source/drain patterns are formed, by the evaporation method such as sputtering or the like, the protection film 98a where an inorganic insulation material like as SiNx, SiOx or acryl organic compound of which the dielectric coefficient is low, an organic insulation material like BCB or PFCB is evaporated entirely, and on the protection film 98a, the photoresist is spread entirely. Subsequently, by the photolithography process using the third mask, as shown in FIG. 8b, the photoresist pattern 71c is formed. Subsequently, by use of the photoresist pattern 71c as the mask, the protection film 98a and the gate insulation film 90a are patterned and afterwards in the remainder region except for region where the transparent electrode pattern is formed, the gate insulation pattern 90 and the protection film 98 are formed. Subsequently, on the substrate 88 where the photoresist pattern 71c exists, as shown in FIG. 8c, by the evaporation method like as the sputtering and so on, the transparent electrode material 74a is evaporated. As a transparent electrode material 74a, the Indium Tin Oxide (ITO), Tin Oxide (TO), or Indium Zinc Oxide (IZO) is used. In the thin film transistor array substrate where the transparent electrode material 74a is evaporated, the photoresist pattern 71 c is removed by the strip process using a lift off method. At this time, as the photoresist pattern 71c is reduced, the transparent electrode material 74a evaporated on the photoresist pattern 71c is removed together, and as shown in FIG. 8d, the transparent pattern including the gate pad protection electrode 74, the pixel electrode 76, and the data pad protection electrode 85 are formed.

The gate pad protection electrode 74 is formed to cover the gate pad 56, and the pixel electrode 72 is electrically connected to the drain electrode 62 of the thin film transistor and the storage electrode 66 of the storage capacitor 78 and the data pad protection electrode 85 is electrically connected to the data pad 64.

As described above, the thin film transistor array substrate and the manufacturing method of the same according to the present invention can decrease further a manufacturing cost by means of simplifying the substrate structure and the manufacturing process by adopting a 3-mask process and can therefore increase the manufacturing yield.

In particular, the thin film transistor array substrate and the manufacturing method of the same according to the present invention can decrease the number of mask processes by forming the transparent electrode pattern by the strip process using the same photoresist pattern used in the patterning process of the gate insulation film and the protection film as patterning the transparent electrode on that.

It will be apparent to those skilled in the art that various modifications and variation can be made in the present invention without departing from the spirit or scope of the invention. Thus, it is intended that the present invention cover the modifications and variations of the this invention cover the modifications and variations of this invention provided they come within the scope of the appended claims and their equivalents.

What is claimed is:

1. A thin film transistor array substrate, comprising:
   a gate pattern including:
   a gate electrode of the thin film transistor;
   a gate line to which the gate electrode is connected; and
   a gate pad to which the gate line is connected;
   a source/drain pattern including:
   a source electrode and a drain electrode of the thin film transistor;
   a data line connected to the source electrode;
   a data pad connected to the data line;
   a storage electrode formed and superimposed with the gate line;
   a semiconductor pattern formed in a low region of the substrate corresponding to the source/drain pattern;
   a transparent electrode including a pixel electrode connected to the drain electrode and the storage electrode, a gate pad protection electrode covering the gate pad, and a data pad protection electrode formed to cover the data pad; and
   a protection pattern and a gate insulation pattern stacked in the remainder region except for the region where the transparent electrode pattern is formed.

2. The thin film transistor array substrate according to claim 1, wherein the protection pattern partially exposes the drain electrode and the storage electrode and is connected to the pixel electrode.

3. A thin film transistor array substrate, comprising:
   a gate electrode of the thin film transistor;
   a gate line to which the gate electrode is connected; and
   a gate pad to which the gate line is connected;
   a source electrode and a drain electrode of the thin film transistor;
   a data line connected to the source electrode;
   a data pad connected to the data line;
   a storage electrode formed and superimposed over the gate line;
   a transparent electrode including a pixel electrode connected to the drain electrode and the storage electrode, a gate pad protection electrode covering the gate pad, and a data pad protection electrode formed to cover the data pad; and
   a protection layer and a gate insulation layer stacked in a region of the substrate other than the region where the transparent electrode is formed.

4. The thin film transistor array substrate according to claim 3, wherein the protection layer partially exposes the drain electrode and the storage electrode and is connected to the pixel electrode.

* * * * *